US007746561B2

(12) United States Patent
Ozawa

(10) Patent No.: US 7,746,561 B2
(45) Date of Patent: Jun. 29, 2010

(54) PROJECTION OPTICAL SYSTEM, EXPOSURE APPARATUS, AND METHOD OF MANUFACTURING DEVICE

(75) Inventor: Kazuyoshi Ozawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 95 days.

(21) Appl. No.: 12/234,950

(22) Filed: Sep. 22, 2008

(65) Prior Publication Data
US 2009/0080068 A1 Mar. 26, 2009

(30) Foreign Application Priority Data
Sep. 26, 2007 (JP) ............... 2007-250069

(51) Int. Cl.
G02B 3/00 (2006.01)
G02B 9/08 (2006.01)
G03B 27/42 (2006.01)
G03B 27/54 (2006.01)
G03B 27/72 (2006.01)

(52) U.S. Cl. .................... 359/649; 355/53; 355/67; 355/71; 359/740

(58) Field of Classification Search .............. 355/53, 355/67, 71; 359/364, 365, 649, 726, 738, 359/739, 740
See application file for complete search history.

(56) References Cited

U.S. PATENT DOCUMENTS 5,363,172 A * 11/1994 Tokuda ................. 355/71

5,592,329 A * 1/1997 Ishiyama et al. ........... 359/399
7,023,953 B2 * 4/2006 Komatsuda ................. 378/34
7,295,285 B2 * 11/2007 Hiura ....................... 355/30
7,310,131 B2 12/2007 Jasper

FOREIGN PATENT DOCUMENTS

| JP | 02-148011 A | 6/1990 |
| JP | 3690819 A | 8/1994 |
| JP | 2002-118053 A | 4/2002 |
| JP | 2007-043168 A | 2/2007 |

* cited by examiner

Primary Examiner—David N Spector
(74) Attorney, Agent, or Firm—Canon U.S.A., Inc., IP Division

(57) ABSTRACT

A projection optical system which projects an image of a first object onto a second object includes a plurality of lenses and a plurality of aperture stops for determining a numerical aperture. The plurality of aperture stops include a first aperture stop having an opening whose size can be changed, and a second aperture stop having an opening whose size can be changed. The first and second aperture stops are positioned nearer to the second object than a lens having the maximum effective diameter among the lenses included in an imaging optical system nearest to the second object. At least one of the first and second aperture stops is positioned at or near the pupil of the imaging optical system. The range of the numerical aperture determined by the first aperture stop is larger than the range of the numerical aperture determined by the second aperture stop.

11 Claims, 12 Drawing Sheets

FIG. 4
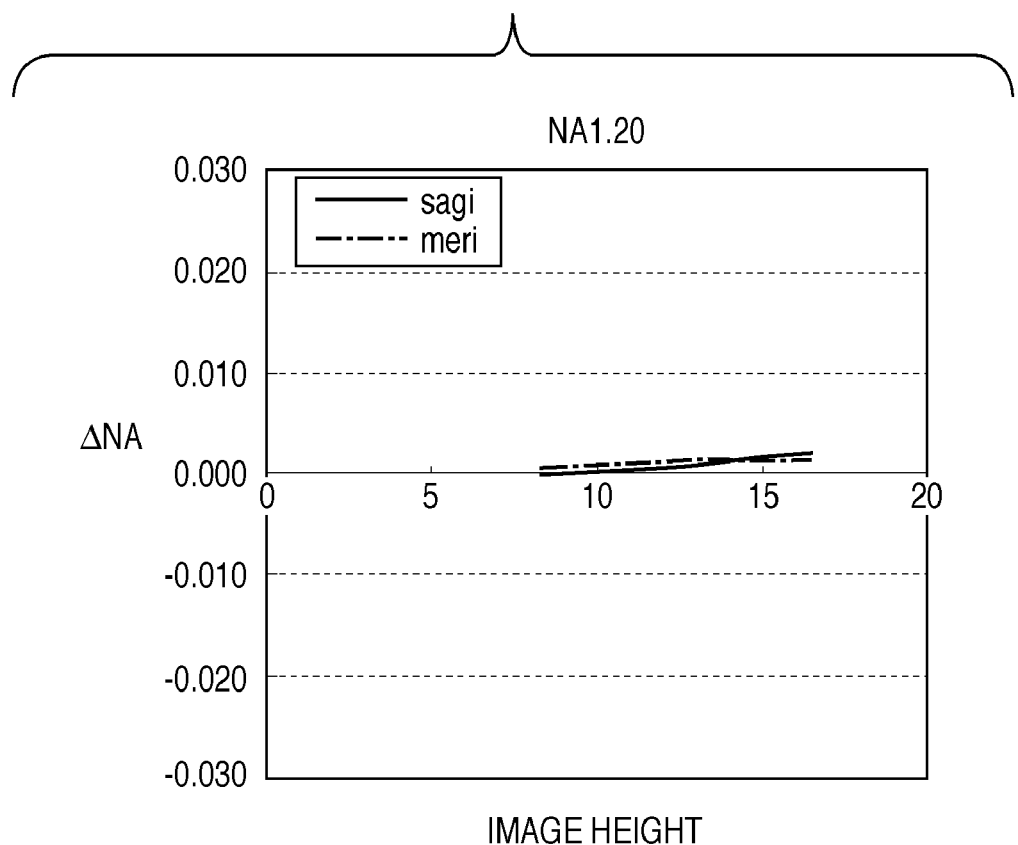
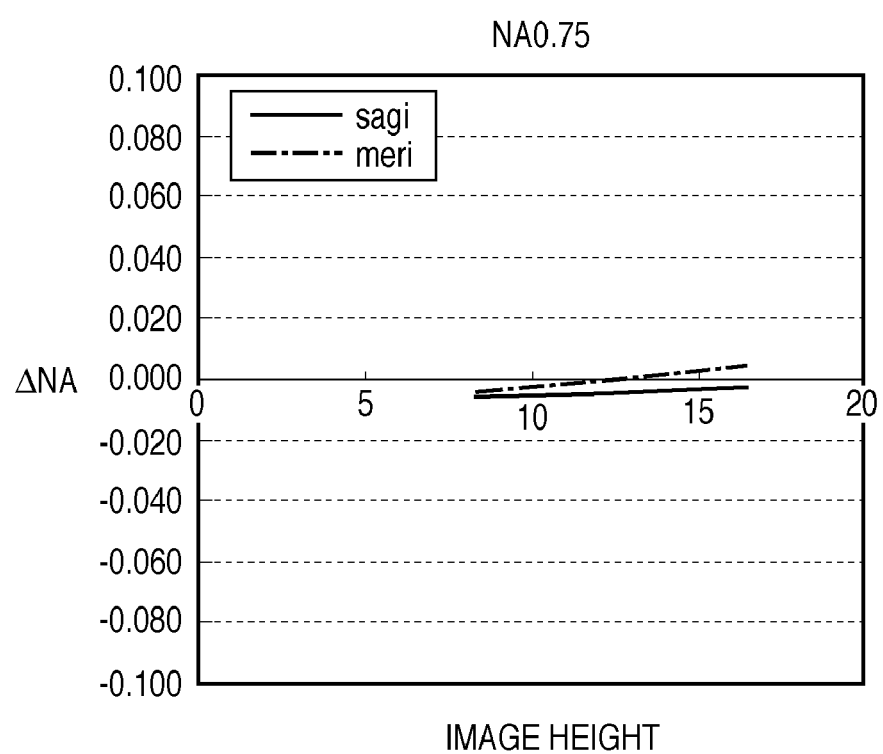

FIG. 7
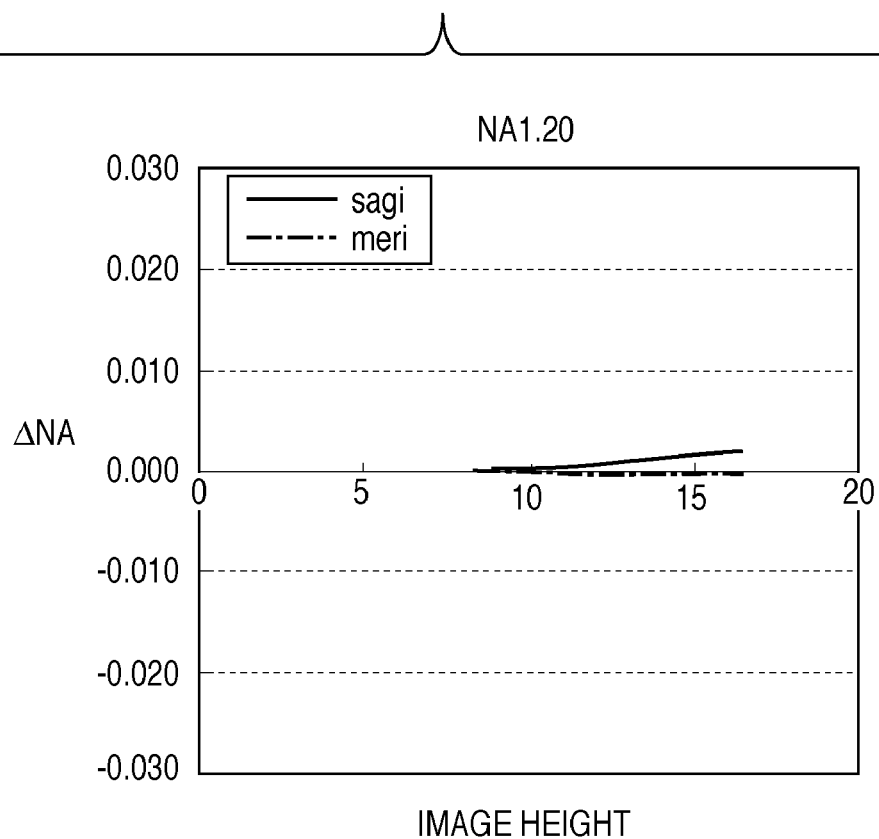
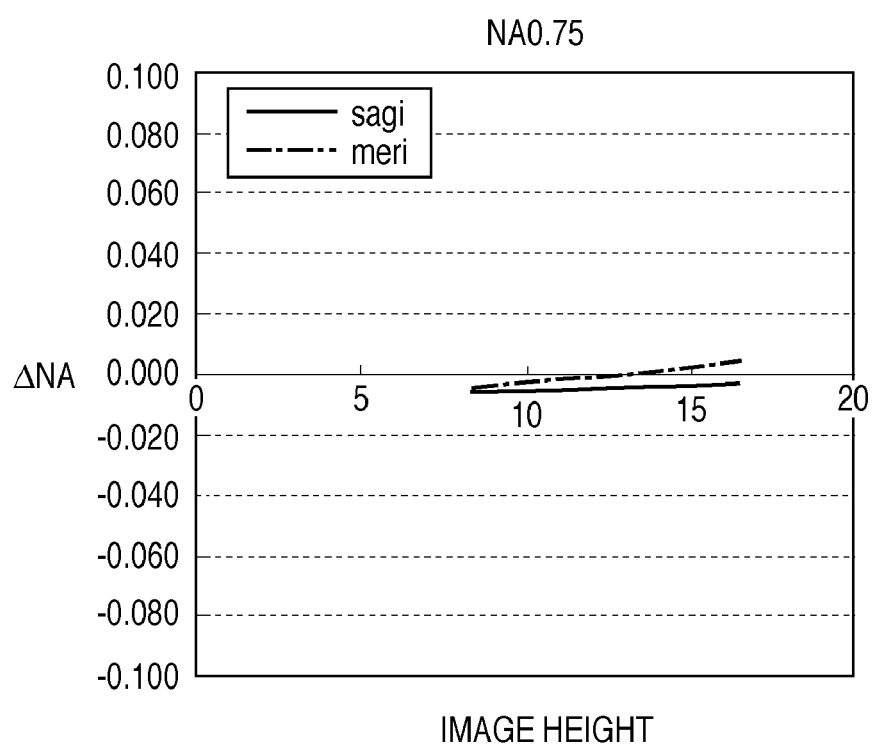

FIG. 11
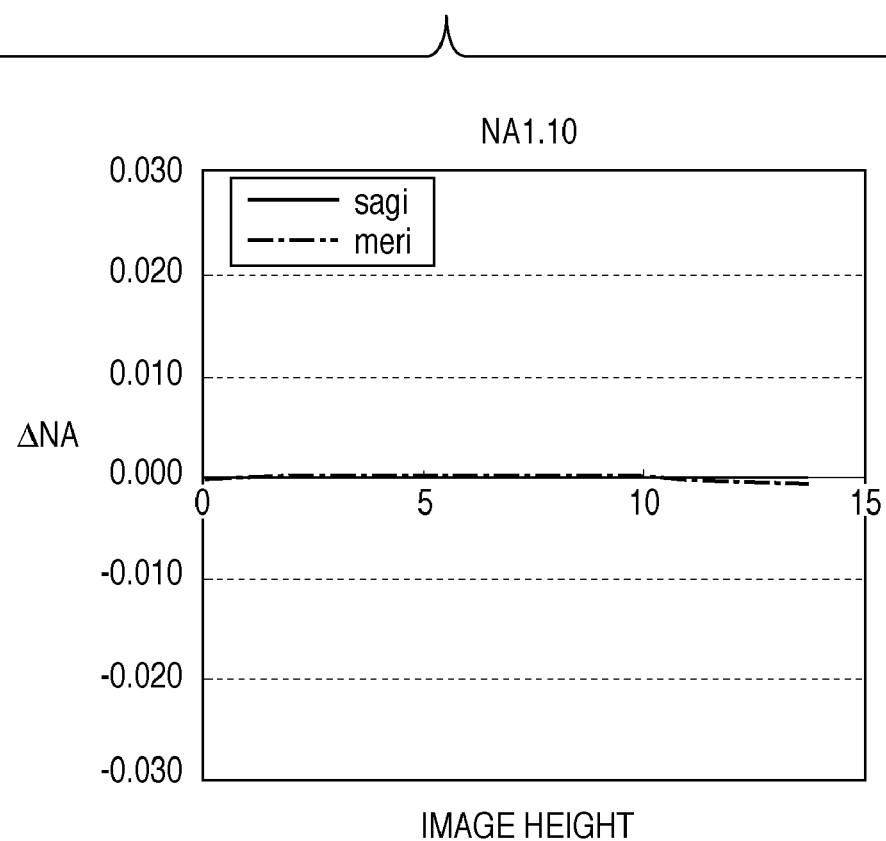
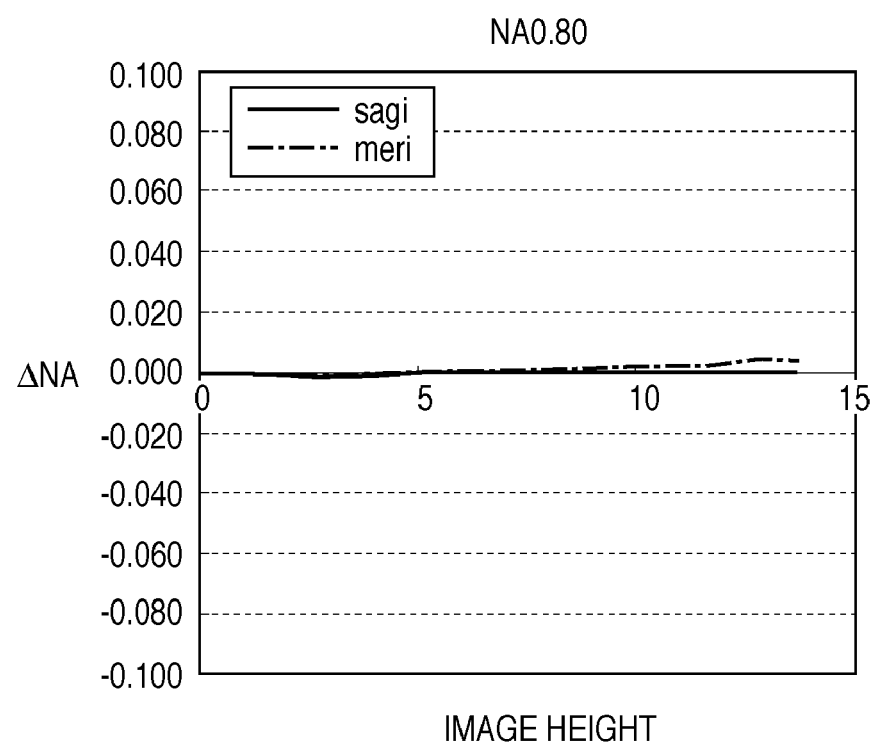

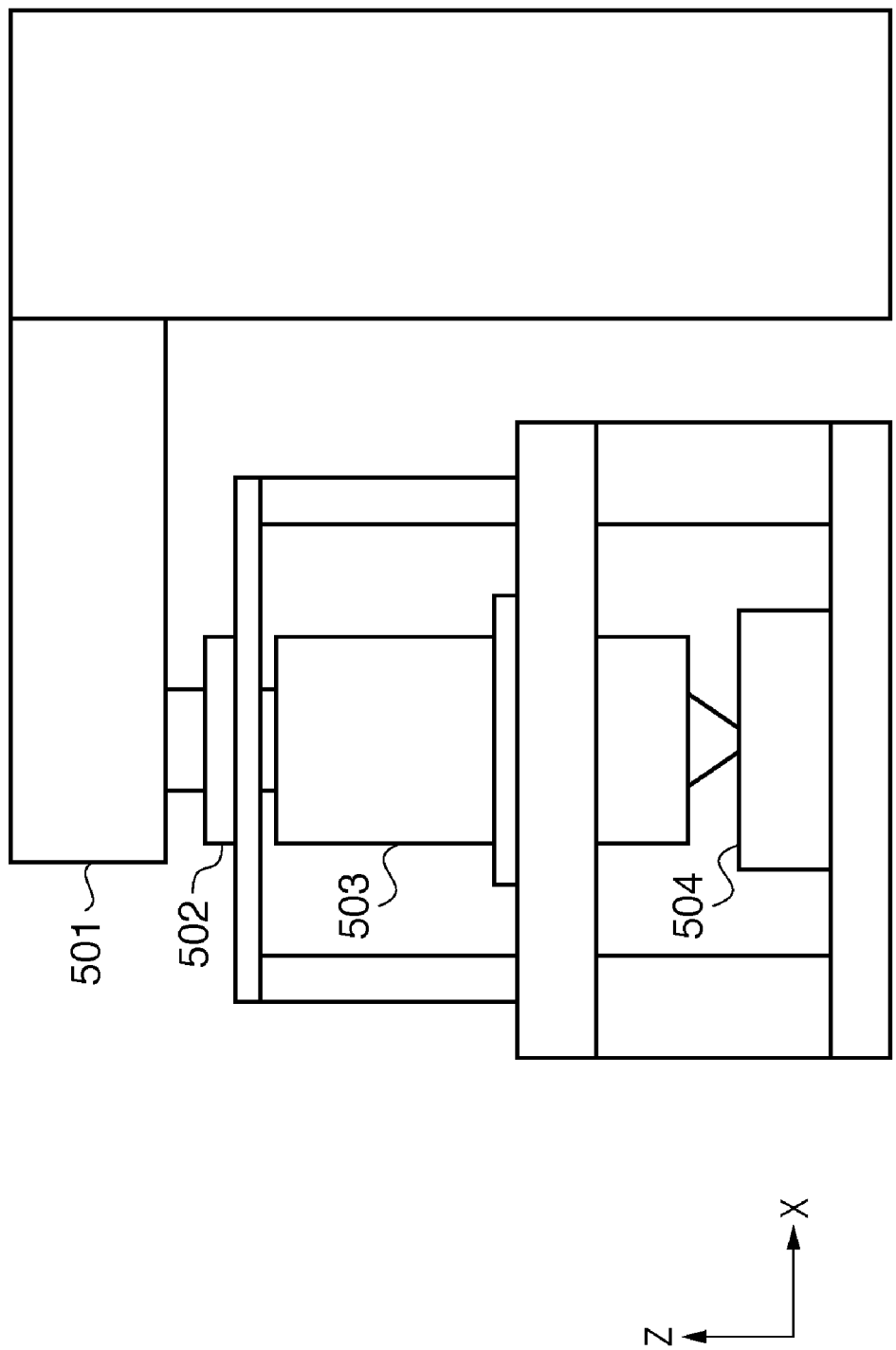

PROJECTION OPTICAL SYSTEM, EXPOSURE APPARATUS, AND METHOD OF MANUFACTURING DEVICE

BACKGROUND OF THE INVENTION

1. Field of the Invention

The present invention relates to a projection optical system, an exposure apparatus, and a method of manufacturing a device.

2. Description of the Related Art

Conventionally, a projection exposure apparatus has been widely used, which projects a circuit pattern drawn on a reticle onto a wafer or the like as a substrate by using a projection optical system and transfers the circuit pattern onto the wafer.

Recently, with demands for miniaturization of semiconductor devices, higher resolutions have been required for projection optical systems. In order to meet this requirement, the wavelength of exposure light may be decreased, and the numerical aperture (NA) of a projection optical system may be increased. An immersion projection optical system has also been proposed, which can achieve an NA of 1 or more by a so-called immersion technique of filling the space between the final lens (final surface) of a projection optical system and a wafer with a liquid. To provide a projection optical system having extremely high performance, requirements for extreme reductions in various aberrations as well as increases in resolution have become severer.

An exposure apparatus including a projection optical system is required to satisfy both the above requirements for high optical performance and miniaturization. An increase in the aperture of a glass material with an increase in NA has become a large factor that increases the cost of an exposure apparatus.

Satisfying both the requirements for an increase in the NA of a projection optical system and exposure apparatus and their miniaturization will increase the refracting power of each lens constituting the projection optical system. As the refracting power of each lens increases, a light beam is strongly bent or bounced. This causes a large difference in pupil shape between on-axis light and off-axis light, resulting in an increase in so-called pupil aberration.

As pupil aberrations, especially the curvature of field of the pupil and the comatic aberration of the pupil increase, the image-side telecentric characteristic of a projection optical system deteriorates, and image distortion in the exposure apparatus increases. In addition, variations in NA (ΔNA) between image heights relative to the desired NA of the projection optical system increase. As a result, it becomes impossible to maintain the high uniformity of the set NA values of the exposure apparatus.

As a measure against a deterioration in image telecentric characteristic due to the influence of pupil aberration, a technique has been proposed, which positions two variable aperture stops at a plurality of positions near the pupil position in a projection exposure apparatus including a projection optical system having an NA of about 0.75. This proposal is disclosed in, for example, Japanese Patent Laid-Open No. 2002-118053.

Furthermore, recently, with an increase in the NA of a projection exposure apparatus, an exposure apparatus including a projection optical system of a plural-times imaging system has been proposed. According to this proposal, a variable aperture stop is positioned in each imaging optical system of the plural-times imaging system, that is, at each pupil position (see, for example, Japanese Patent No. 3690819 and Japanese Patent Laid-Open No. 2007-043168).

The optical system disclosed in Japanese Patent Laid-Open No. 2002-118053 is a dioptric (refractive) projection optical system of a one-time imaging system with a numerical aperture (NA) of 0.75. This optical system achieves good optical performance in a desired NA area by adjusting the upper-side light and lower-side light of a light beam using two aperture stops positioned near the pupil position.

When, however, both the requirements for a further increase in NA and miniaturization are to be satisfied, the refracting power corresponding to the maximum lens diameter increases, the curvature of the pupil is also positioned on the wafer side. For this reason, the arrangement comprising the two aperture stops described in Japanese Patent Laid-Open No. 2002-118053 cannot achieve a desired image-side telecentric characteristic, and the inter-image-height NA variations also increase. Furthermore, there is no description about the range of the numerical aperture determined by the two aperture stops.

The optical system disclosed in Japanese Patent No. 3690819 is a catadioptric projection optical system of a two-times imaging system. The optical system disclosed in Japanese Patent Laid-Open No. 2007-043168 is a dioptric projection optical system of a two-times imaging system. These references disclose a technique of achieving a desired image-side telecentric characteristic and inter-image-height NA uniformity in both the optical systems by positioning a variable aperture stop at the pupil position in each imaging optical system.

In order to form the aperture stop mechanisms of a projection optical system and exposure apparatus more simply, an aperture stop is preferably positioned near one pupil position regardless of the number of times of imaging. In general, positioning stops at a plurality of pupil positions while maintaining miniaturization is not preferable for correcting aberrations. Furthermore, it is not preferable to position a stop near a pupil position other than that of the final imaging system. This is because, since the tilt of a light beam passing through the aperture stop increases, aberration sensitivity generally increases due to the errors of the diameter and position of the aperture stop.

SUMMARY OF THE INVENTION

It is an exemplary object of the present invention to provide a projection optical system which achieves good optical performance in a wide NA area, a desired image-side telecentric characteristic, and inter-image-height NA uniformity.

According to an aspect of the present invention, there is provided a projection optical system which projects an image of a first object onto a second object, the projection optical system comprises:

a plurality of lenses; and a plurality of aperture stops for determining a numerical aperture, wherein the plurality of aperture stops include a first aperture stop having an opening whose size is configured to be changed, and a second aperture stop having an opening whose size is configured to be changed, wherein the first aperture stop and the second aperture stop are positioned nearer to the second object than a lens having a maximum effective diameter among lenses included in an imaging optical system nearest to the second object, wherein at least one of the first aperture stop and the second aperture stop is positioned at or near a pupil of the imaging optical system, and wherein a range of a numerical aperture determined by the first aperture stop is larger than a range of a numerical aperture determined by the second aperture stop.

Further features and aspects of the present invention will become apparent from the following description of exemplary embodiments with reference to the attached drawings.

BRIEF DESCRIPTION OF THE DRAWINGS

FIG. 4 is a graph showing NA uniformity in the first numerical embodiment;

FIG. 7 is a graph showing NA uniformity in the second numerical embodiment;

FIG. 11 is a graph showing NA uniformity in the third numerical embodiment; and

FIG. 12 is a view for explaining an exposure apparatus.

DESCRIPTION OF THE EMBODIMENTS

Embodiment of Projection Optical System

A projection optical system having a plurality of aperture stops according to an aspect of the present invention will be described below with reference to the accompanying drawings.

Figures 1A, 1B:
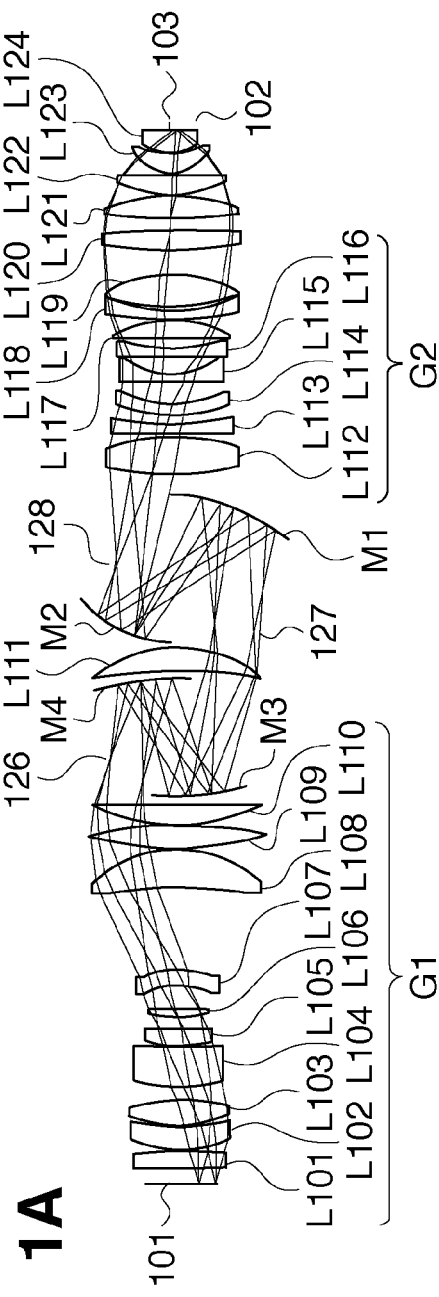
FIG. 1A is a sectional view of a projection optical system according to the first numerical embodiment.
FIG. 1B is an enlarged sectional view near the aperture stops of the projection optical system of the first numerical embodiment.

FIG. 1A shows the lens arrangement of a catadioptric projection optical system as the first numerical embodiment. Referring to FIG. 1A, an imaging optical system G1, an intermediate image 127 of a real image, a reflecting concave mirror M1, a concave mirror M2, an intermediate image 128 of the real image, and an imaging optical system G2 are sequentially arranged from the first object 101 side along an optical path.

FIG. 1B is an enlarged sectional view near aperture stops. Obviously, unlike a known conventional example, in order to satisfy both the requirements for a further increase in NA and miniaturization, the pupil curves largely toward the wafer side from a lens L120 having the maximum effective diameter among the lenses included in the imaging optical system G2 nearest to a second object. The curvature of the pupil is especially noticeable on the high NA side. Obviously, therefore, to achieve good optical performance in a wide NA area, it is necessary to position an aperture stop at a position nearer to the second object side than the lens having the maximum effective diameter.

According to the present invention, each projection optical system is configured to project an image of the first object onto the second object, and includes a plurality of lenses and first and second aperture stops SP1 and SP2 for determining a numerical aperture.

Owing to the curvature of the above pupil, when a numerical aperture is to be determined by only the first aperture stop, the telecentricity and NA variations between image heights undesirably increase. In this case, it has been found that since the curvature of the pupil is large especially on the high NA side, a numerical aperture can be effectively determined by simultaneously using the second aperture stop as well as the first aperture stop. In this case, the range of the numerical aperture determined by the first aperture stop is preferably larger than that determined by the second aperture stop.

Assume that the numerical aperture of the projection optical system ranges from a value equal to or more than NAmin to that equal to or less than NAmax, the numerical aperture determined by the first aperture stop ranges from a value equal to or more than NAmin1 to that equal to or less than NAmax1, and the numerical aperture determined by the second aperture stop ranges from a value equal to or more than NAmin2 to that equal to or less than NAmax2. In this case, it is preferable to set aperture stops so as to make NAmax, NAmin, NAmax1, NAmin1, NAmax2, and NAmin2 satisfy inequality (1) given below:

$$|NAmax2-NAmin2| \leq |NAmax1-NAmin1| \leq |NAmax-NAmin| \quad (1)$$

Expressions (2) and (3) given below are conditional expressions which define the relationship between the range of the numerical aperture determined by the first aperture stop and the range of the numerical aperture determined by the second aperture stop.

$$NAmin=NAmin1<NAmin2<NAmax1 \leq NAmax \quad (2)$$

$$NAmin=NAmin1<NAmin2<NAmax2 \leq NAmax \quad (3)$$

Since the curvature of the pupil is not very large in the range on the low NA side, a numerical aperture can be determined by only the first aperture stop. In this case, NAmin1 is equal to NAmin. In addition, the second aperture stop determines a numerical aperture only in the range on the high NA side. In this case, NAmin2 is larger than NAmin1. If NAmin2 is larger than NAmax1, a numerical aperture is not determined in the range of NAmax or more to NAmin2 or less.

Equation (4) given below is especially preferable because better optical performance can be obtained by NAmax.

$$NAmax1=NAmax2=NAmax \quad (4)$$

In addition, at least one lens can be positioned between the first and second aperture stops.

In addition, it is preferable to use the third aperture stop in the area on the high NA side where the influence of the curvature of the pupil is high. When the numerical aperture determined by the third aperture stop ranges from a value equal to or more than NAmin3 to that equal to or less than NAmax3, the aperture stop is preferably set to satisfy expression (5) given below:

$$NAmin2<NAmin3 \leq NAmax3=NAmax3 \quad (5)$$

Equation (6) given below is especially preferable because better optical performance can be obtained by NAmax.

$$NAmin3=NAmax3=NAmax \quad (6)$$

In this case, the third aperture stop is a fixed stop.

In the present invention, the first aperture stop, the second aperture stop, at least one lens included in the imaging optical system, and the third aperture stop are sequentially positioned from the first object side.

In addition, the projection optical system according to the present invention preferably achieves good optical performance, a desired image-side telecentric characteristic, and inter-image-height NA uniformity in the entire NA range of NAmin or more to NAmax or less.

Letting θ1 be the angle defined by upper-side light on the object surface side and an optical axis, and θ2 be the angle defined by lower-side light and the optical axis, telecentricity Tel. representing an image-side telecentric characteristic is given by using the tangent of the angle of an object-side principal ray.

$$Tel. = |\tan((\theta_1 + \theta_2)/2)| \quad (7)$$

The projection optical system according to the present invention preferably satisfies the following condition in the entire NA range of NAmin or more to NAmax or less.

$$|Tel.| < 0.010 \quad (8)$$

If conditional expression (8) is not satisfied in the NA range of NAmin or more to NAmax or less, the line width uniformity between image heights becomes excessive, and hence a good image cannot be obtained.

In addition, inter-image-height variations representing NA uniformity are represented by ΔNA. The projection optical system according to the present invention preferably satisfies the following condition in the entire NA range of NAmin or more to NAmax or less.

$$|\Delta NA| < 0.008 \quad (9)$$

If conditional expression (9) is not satisfied in the NA range of NAmin or more to NAmax or less, a distortion difference occurs between image heights, and hence a good image cannot be obtained.

Furthermore, the projection optical system according to the present invention is preferably configured such that at least one of the first and second aperture stops positioned in the system can move in the optical axis direction.

The numerical embodiments of the projection optical system according to the present invention will be described below.

First Numerical Embodiment

FIG. 1A shows the lens arrangement of a catadioptric projection optical system as the first numerical embodiment. Referring to FIG. 1A, the imaging optical system G1, the intermediate image 127 of the real image, the reflecting concave mirror M1, the concave mirror M2, the intermediate image 128 of the real image, and the imaging optical system G2 are sequentially arranged from the first object 101 side along the optical path.

In the first numerical embodiment, the imaging optical system G1 comprises lenses L101 to L110, a concave mirror M3, a concave mirror M4, and a lens L111. More specifically, the imaging optical system G1 sequentially has, from the first object side, the aspherical positive lens L101 having a nearly plano-convex shape with its nearly flat surface facing the first object side, the aspherical positive lens L102 having a meniscus shape with its convex surface facing the first object side, and the positive lens L103 having a biconvex shape. Following the lens L103, the imaging optical system G1 sequentially has the meniscus positive lens L104 with its convex surface facing the first object side and the meniscus aspherical lens L105 with its convex surface facing the first object side. Following the lens L105, the imaging optical system G1 sequentially has the positive lens L106 having a biconvex shape and the aspherical positive lens L107 having a meniscus shape with its concave surface facing the first object side. Following the lens L107, the imaging optical system G1 sequentially has the positive lens L108 having a meniscus shape with its convex surface facing the second object side, the positive lens L109 having a biconvex shape, and the positive lens L110 having a nearly plano-convex shape with its convex surface facing the first object side. In addition, the imaging optical system G1 sequentially has the concave mirror M4, the concave mirror M3, and the positive lens L111 having a meniscus shape with its convex surface facing the second object side.

The imaging optical system G2 comprises lenses L112 to L124. More specifically, the imaging optical system G2 sequentially has the positive lens L112 having a biconvex shape, the aspherical negative lens L113 having a nearly plano-concave shape with its concave surface facing the second object side, and the negative lens L114 having a meniscus shape with its concave surface facing the second object side. Following the lens L114, the imaging optical system G2 sequentially has the negative lens L115 having a nearly plano-concave shape with its concave surface facing the second object side, the aspherical negative lens L116 having a biconcave shape with its concave surface facing the second object side, and the positive lens L117 having a biconvex shape. Following the lens L117, the imaging optical system G2 sequentially has the aspherical negative lens L118 having a meniscus shape with its concave surface facing the second object side, the aspherical positive lens L119 having a biconvex shape, the positive lens L120 having a biconvex shape, and the aspherical positive lens L121 having a biconvex shape. Following the lens L121, the imaging optical system G2 sequentially has the aspherical positive lens L122 having a nearly plano-convex shape with its convex surface facing the first object side, the positive lens L123 having a meniscus shape with its concave surface facing the second object side, and the positive lens L124 having a plano-convex shape with its flat surface facing the second object side. The space between the positive lens L124 and the second object 102 is filled with a liquid.

Figure 2:
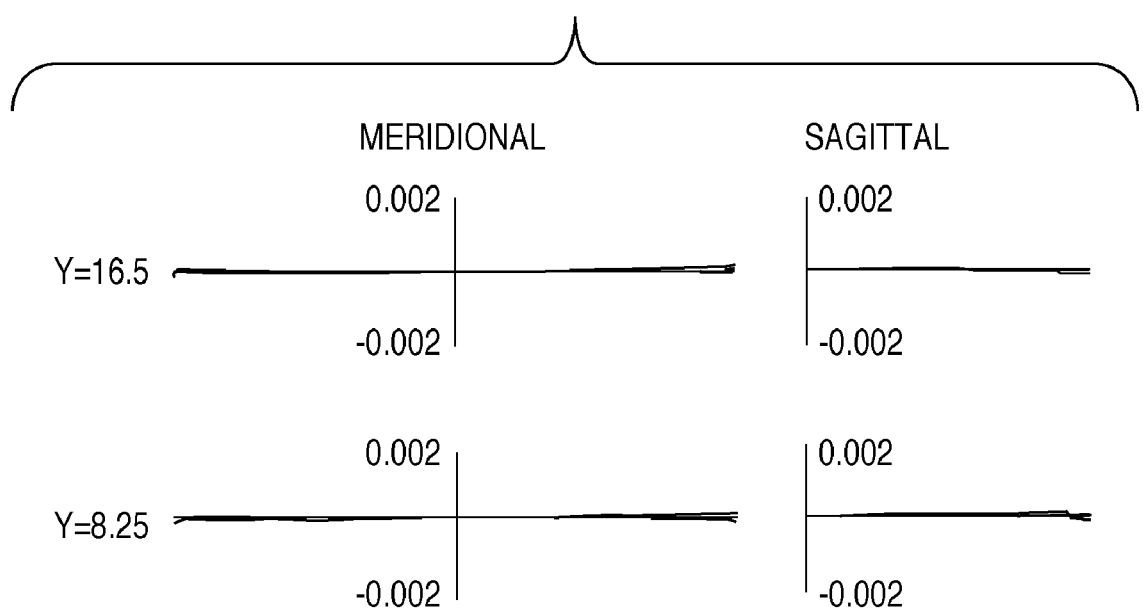
FIG. 2 is a view showing the transverse aberration of the projection optical system of the first numerical embodiment.

In the first numerical embodiment, a projection magnification β is ¼, the reference wavelength is 193 nm, and quartz is used as a glass material. In addition, the image-side numerical aperture is given by NAmax=1.20 and NAmin=0.75, and the inter-object distance (between the first object surface and the second object surface) is given by TT=1879 mm. Aberration correction is performed in the range of image heights of 8.25 to 16.5 mm, and an off-axis rectangular illumination area having a length of at least 22 mm and a width of at least 4 mm can be secured. The illumination area to be secured is not limited to a rectangular shape. For example, an arcuated illumination area can be secured. FIG. 2 is a transverse aberration diagram in the first numerical embodiment. Referring to FIG. 2, "meridional" represents aberration with respect to a meridional ray included in a meridian plane including a principal ray and an optical axis, and "sagittal" represents transverse aberration with respect to a sagittal ray included in a sagittal plane which includes the principal ray and is perpendicular to "meridional". FIG. 2 shows the transverse aberration for the reference wavelength of 193.0 nm and wavelengths of ±0.2 pm. As is obvious, monochromatic aberration and chromatic aberration are properly corrected.

Tables 1 and 2 show various constituent factors or elements of the first numerical embodiment.

TABLE 1

NA = 1.20
$\beta = \frac{1}{4}$

|  | Radius of Curvature [mm] | Surface Interval [mm] | Material |
|---|---|---|---|
|  | r0 = ∞ | d0 = 25.19881 |  |
|  | r1 = 10146.97189 | d1 = 33.27555 | SiO₂ |
| Aspherical Surface | r2 = −696.78276 | d2 = 1.59058 |  |
|  | r3 = 223.04724 | d3 = 41.44895 | SiO₂ |
| Aspherical Surface | r4 = 621.07430 | d4 = 2.39338 |  |
|  | r5 = 223.44378 | d5 = 46.39318 | SiO₂ |
|  | r6 = −310.19954 | d6 = 20.93568 |  |
|  | r7 = 281.76963 | d7 = 70.00000 | SiO₂ |
|  | r8 = 478.35430 | d8 = 1.05014 |  |
|  | r9 = 156.81626 | d9 = 32.00000 | SiO₂ |
| Aspherical Surface | r10 = 1393.77884 | d10 = 21.26122 |  |
|  | r11 = 192.11219 | d11 = 18.04448 | SiO₂ |
|  | r12 = −438.32491 | d12 = 39.17674 |  |
|  | r13 = −138.24946 | d13 = 29.94391 | SiO₂ |
| Aspherical Surface | r14 = −140.10195 | d14 = 142.39793 |  |
|  | r15 = −938.67110 | d15 = 69.95628 | SiO₂ |
|  | r16 = −222.66871 | d16 = 3.02453 |  |
| Aspherical Surface | r17 = 463.33151 | d17 = 40.03651 | SiO₂ |
|  | r18 = −777.63117 | d18 = 1.01162 |  |
|  | r19 = 362.03914 | d19 = 37.24490 | SiO₂ |
|  | r20 = −37671.40243 | d20 = 222.43920 |  |
| Aspherical Surface | r21 = −453.83756 | d21 = −209.43920 | M1 |
| Aspherical Surface | r22 = 476.77816 | d22 = 219.45691 | M2 |
|  | r23 = −1022.17036 | d23 = 44.83508 | SiO₂ |
|  | r24 = −237.79552 | d24 = 273.90045 |  |
| Aspherical Surface | r25 = −259.72457 | d25 = −263.90045 | M3 |
| Aspherical | r26 = 206.41831 | d26 = 299.17954 | M4 |

TABLE 1-continued

NA = 1.20
$\beta = \frac{1}{4}$

|  | Radius of Curvature [mm] | Surface Interval [mm] | Material |
|---|---|---|---|
| Surface |  |  |  |
|  | r27 = 531.56280 | d27 = 69.63840 | SiO₂ |
|  | r28 = −358.10120 | d28 = 3.42596 |  |
|  | r29 = −6427.57519 | d29 = 17.00000 | SiO₂ |
| Aspherical Surface | r30 = 268.46014 | d30 = 17.29040 |  |
|  | r31 = 312.59734 | d31 = 18.06066 | SiO₂ |
|  | r32 = 187.02633 | d32 = 39.67385 |  |
|  | r33 = 5038.91186 | d33 = 15.00000 | SiO₂ |
|  | r34 = 152.80935 | d34 = 32.89949 |  |
|  | r35 = −1266.52726 | d35 = 12.38230 | SiO₂ |
| Aspherical Surface | r36 = 488.73734 | d36 = 11.17247 |  |
|  | r37 = 909.44854 | d37 = 37.53576 | SiO₂ |
|  | r38 = −227.20912 | d38 = 2.64792 |  |
| Aspherical Surface | r39 = 527.01980 | d39 = 15.00000 | SiO₂ |
|  | r40 = 306.05858 | d40 = 6.82121 |  |
| Aspherical Surface | r41 = 314.07332 | d41 = 59.13044 | SiO₂ |
|  | r42 = −226.00767 | d42 = 42.81271 |  |
|  | r43 = 710.23699 | d43 = 34.98128 | SiO₂ |
|  | r44 = −1416.98175 | d44 = 5.19542 |  |
| Aperture Stop 1 | r45 = ∞ | d45 = 11.79859 |  |
| Aperture Stop 2 | r46 = ∞ | d46 = 1.00000 |  |
| Aspherical Surface | r47 = 540.08365 | d47 = 42.97739 | SiO₂ |
|  | r48 = −333.38314 | d48 = 1.00000 |  |
|  | r49 = 185.39931 | d50 = 36.98466 | SiO₂ |
| Aspherical Surface | r50 = 5111.36331 | d51 = 1.00000 |  |
|  | r51 = 78.22041 | d52 = 38.52383 | SiO₂ |
|  | r52 = 172.70908 | d53 = 1.00000 |  |
|  | r53 = 80.18403 | d54 = 37.76846 | SiO₂ |
|  | r54 = ∞ | d55 = 3.00000 | Water |
|  | r55 = ∞ | d56 = 0.00000 | Water |
|  |  | TT 1878.57716 |  |

TABLE 2

Aspherical DATA

| Surface Number | K | A | B | C |
|---|---|---|---|---|
| 2 | 0.0000000 | 2.7432792E−08 | −2.5615490E−12 | 4.0574773E−16 |
| 4 | 0.0000000 | 8.5428554E−08 | −4.9751307E−13 | −4.3963024E−16 |
| 10 | 0.0000000 | 2.0335307E−07 | 1.6136337E−11 | 3.2687229E−15 |
| 14 | 0.0000000 | 1.6974276E−07 | 1.4147300E−11 | 3.3139005E−15 |
| 17 | 0.0000000 | −1.2732737E−08 | 3.0271335E−14 | −1.2437317E−18 |
| 21 | −1.7398653 | 0.0000000E+00 | 0.0000000E+00 | 0.0000000E+00 |
| 22 | −0.7426191 | 0.0000000E+00 | 0.0000000E+00 | 0.0000000E+00 |
| 25 | −1.0242038 | 0.0000000E+00 | 0.0000000E+00 | 0.0000000E+00 |
| 26 | −0.2766891 | 0.0000000E+00 | 0.0000000E+00 | 0.0000000E+00 |
| 30 | 0.0000000 | −9.2657064E−08 | 3.9348832E−14 | 1.2760844E−16 |
| 36 | 0.0000000 | 4.9982201E−08 | 2.0607747E−12 | −1.2363248E−16 |
| 39 | 0.0000000 | −3.6413469E−08 | 4.1756539E−13 | 1.1777651E−16 |
| 41 | 0.0000000 | −1.5798642E−08 | 6.6478338E−14 | −9.2046166E−17 |
| 47 | 0.0000000 | −1.4920421E−08 | −2.4591555E−13 | 3.0537592E−17 |
| 50 | 0.0000000 | −2.9480585E−08 | 2.3593582E−12 | 3.4771792E−17 |

| Surface Number | D | E | F |
|---|---|---|---|
| 2 | −2.6199856E−20 | −7.9001139E−25 | 1.5280820E−28 |
| 4 | 5.8618954E−20 | −2.7564328E−24 | 2.8581860E−29 |
| 10 | 9.0866227E−19 | 3.1929390E−22 | 1.5127264E−35 |
| 14 | −1.4245774E−21 | −1.4783031E−23 | 8.9980415E−28 |
| 17 | 2.1399058E−23 | −4.6269301E−28 | 2.7824239E−33 |

TABLE 2-continued

Aspherical DATA

| | | | |
|---|---|---|---|
| 21 | 0.0000000E+00 | 0.0000000E+00 | 0.0000000E+00 |
| 22 | 0.0000000E+00 | 0.0000000E+00 | 0.0000000E+00 |
| 25 | 0.0000000E+00 | 0.0000000E+00 | 0.0000000E+00 |
| 26 | 0.0000000E+00 | 0.0000000E+00 | 0.0000000E+00 |
| 30 | −4.3620593E−21 | −2.1094849E−26 | 2.5061442E−30 |
| 36 | −8.9063677E−21 | −4.4938672E−27 | 3.4808590E−30 |
| 39 | −6.4269501E−21 | 2.3350124E−25 | −7.5055047E−30 |
| 41 | 6.0261198E−21 | −2.0701835E−25 | 2.6977447E−30 |
| 47 | 1.7455885E−21 | −1.2224718E−25 | 1.8384286E−30 |
| 50 | −6.8568697E−21 | 3.6576165E−25 | −5.4395859E−30 |

Let ri be the radius of curvature of each surface corresponding to a surface number, and di be the intervals between the respective surfaces. The refractive indexes of lens glass material $SiO_2$ and pure water with respect to the reference wavelength $\lambda=193.0$ nm are 1.5609 and 1.437, respectively. The refractive indexes of $SiO_2$ with respect to wavelengths of +0.2 pm and −0.2 pm relative to the reference wavelength are 1.56089968 and 1.56090031, respectively. The refractive indexes of pure water with respect to these wavelengths are 1.43699576 and 1.437000424, respectively.

Assume that the shape of each aspherical surface is given by $$X=(H^2/4)/(1+((1-(1+K)\cdot(H/r)^2))^{1/2})+AH^4+BH^6+CH^8+DH^{10}+EH^{12}+FH^{14}$$

where X is a displacement amount from the lens vertex in the optical axis direction, H is the distance from the optical axis, r is a radius of curvature, K is a conic constant, and A, B, C, D, E, and F are aspherical coefficients.

FIG. 1B is an enlarged sectional view near aperture stops. As is easily understood from FIG. 1B, unlike a known conventional example, since this embodiment has satisfied both the requirements for a further increase in NA and miniaturization, the pupil curves largely toward the wafer side from the lens L120 having the maximum effective diameter among the lenses included in the imaging optical system G2 nearest to the second object. The curvature of the pupil is especially noticeable on the high NA side. Obviously, therefore, to achieve good optical performance in a wide NA area, it is necessary to position an aperture stop at a position nearer to the wafer side than the lens having the maximum effective diameter.

In the first numerical embodiment, a plurality of aperture stops, that is, the first and second aperture stops SP1 and SP2, are positioned. The plurality of aperture stops SP1 and SP2 are positioned between the lens L121 and the lens L120 having the maximum effective diameter among the plurality of lenses constituting the imaging optical system nearest to the second object of the projection optical system. That is, both the aperture stops SP1 and SP2 are positioned nearer to the second object than the lens L120 having the maximum effective diameter. The first aperture stop SP1 is positioned near the pupil of the projection optical system. At least one of the plurality of aperture stops SP1 and SP2 can move along the optical axis direction of the projection optical system.

According to FIG. 1B, in an optical system whose maximum NA is small like the conventional known example (Japanese Patent Laid-Open No. 2002-118053), since it suffices to perform correction only in an area where the NA is small, a light beam can be adjusted by positioning only the first aperture stop SP1 near the pupil. However, in a large NA area of a projection optical system having a large NA as in the present invention, since the curvature of the pupil is large, it is impossible to achieve a desired image-side telecentric characteristic and NA uniformity by using only one aperture stop SP1. It is possible to achieve a desired image-side telecentric characteristic and NA uniformity by positioning the second aperture stop SP2 along the direction in which the pupil curves, that is, at a position nearer to the second object (wafer) than the first aperture stop SP1 and adjusting a light beam by using a plurality of aperture stops.

Table 3 shows aperture stop diameters corresponding to the respective NAs in the first numerical embodiment.

TABLE 3

| NA | Aperture Stop 1 Diameter | Aperture Stop 2 Diameter |
|---|---|---|
| 1.20 | 226.071 | 224.156 |
| 1.15 | 208.076 | 207.177 |
| 1.10 | 193.368 | 192.499 |
| 1.05 | 179.976 | 179.463 |
| 1.00 | 167.717 | 167.489 |
| 0.95 | 153.323 | 156.352 |
| 0.90 | 145.479 | 156.352 |
| 0.85 | 135.361 | 156.352 |
| 0.80 | 125.731 | 156.352 |
| 0.75 | 116.438 | 156.352 |

The first aperture stop SP1 determines a numerical aperture in the range of 0.75 or more to 1.20 or less, and changes the size of the opening (aperture portion) from NAmax=1.20 to NAmin=0.75. The second aperture stop SP2 determines a numerical aperture in the range of 0.95 or more to 1.20 or less, and changes the size of the opening only on the high NA side with NA=0.95 or more.

Figure 3:
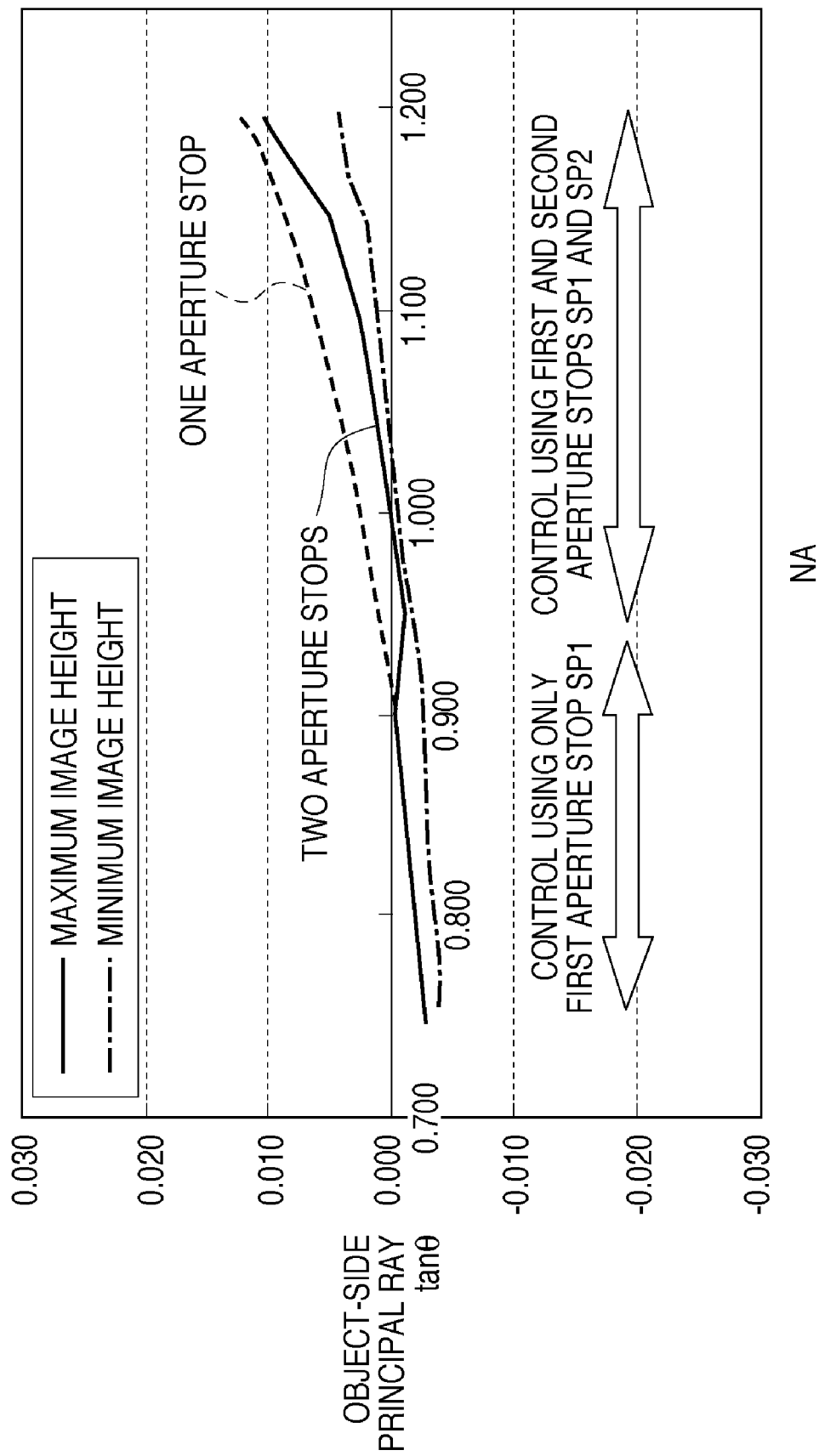
FIG. 3 is a graph showing telecentricity in the first numerical embodiment.

FIG. 3 shows the telecentricity (tan θ of an object-side principal ray) of the first numerical embodiment. The solid line represents the telecentricity obtained by two aperture stops at the maximum image height, the dotted line represents the telecentricity obtained by only one aperture stop at the maximum image height, and the chain line represents the telecentricity obtained by only one aperture stop at the minimum image height. As shown in FIG. 3, it is difficult to achieve a desired telecentricity by using only the aperture stop SP1. Using two aperture stops can achieve a desired image-side telecentric characteristic in the entire wide NA range of NAmax=1.20 to NAmin=0.75.

FIG. 4 shows the NA uniformity (NAmax=1.20 and NAmin=0.75) of the first numerical embodiment. Referring to FIG. 4, a solid line sagi. represents an NA with respect to a sagittal ray, and a dotted line meri. represents an NA with respect to a meridional ray. Using two aperture stops can achieve desired inter-image-height NA uniformity with NAmax=1.20 and NAmin=0.75.

Second Numerical Embodiment

Tables 4 and 5 show various constituent factors or elements of the second numerical embodiment.

TABLE 4

NA = 1.20
$\beta = \frac{1}{4}$

|   | Radius of Curvature [mm] | Surface Interval [mm] | Material |
|---|---|---|---|
|  | r0 = ∞ | d0 = 25.19881 |  |
|  | r1 = 10146.97189 | d1 = 33.27555 | SiO₂ |
| Aspherical Surface | r2 = −696.78276 | d2 = 1.59058 |  |
|  | r3 = 223.04724 | d3 = 41.44895 | SiO₂ |
| Aspherical Surface | r4 = 621.07430 | d4 = 2.39338 |  |
|  | r5 = 223.44378 | d5 = 46.39318 | SiO₂ |
|  | r6 = −310.19954 | d6 = 20.93568 |  |
|  | r7 = 281.76963 | d7 = 70.00000 | SiO₂ |
|  | r8 = 478.35430 | d8 = 1.05014 |  |
|  | r9 = 156.81626 | d9 = 32.00000 | SiO₂ |
| Aspherical Surface | r10 = 1393.77884 | d10 = 21.26122 |  |
|  | r11 = 192.11219 | d11 = 18.04448 | SiO₂ |
|  | r12 = −438.32491 | d12 = 39.17674 |  |
|  | r13 = −138.24946 | d13 = 29.94391 | SiO₂ |
| Aspherical Surface | r14 = −140.10195 | d14 = 142.39793 |  |
|  | r15 = −938.67110 | d15 = 69.95628 | SiO₂ |
|  | r16 = −222.66871 | d16 = 3.02453 |  |
| Aspherical Surface | r17 = 463.33151 | d17 = 40.03651 | SiO₂ |
|  | r18 = −777.63117 | d18 = 1.01162 |  |
|  | r19 = 362.03914 | d19 = 37.24490 | SiO₂ |
|  | r20 = −37671.40243 | d20 = 222.43920 |  |
| Aspherical Surface | r21 = −453.83756 | d21 = −209.43920 | M1 |
| Aspherical Surface | r22 = 476.77816 | d22 = 219.45691 | M2 |
|  | r23 = −1022.17036 | d23 = 44.83508 | SiO₂ |
|  | r24 = −237.79552 | d24 = 273.90045 |  |
| Aspherical Surface | r25 = −259.72457 | d25 = −263.90045 | M3 |

TABLE 4-continued

NA = 1.20
$\beta = \frac{1}{4}$

|   | Radius of Curvature [mm] | Surface Interval [mm] | Material |
|---|---|---|---|
| Aspherical Surface | r26 = 206.41831 | d26 = 299.17954 | M4 |
|  | r27 = 531.56280 | d27 = 69.63840 | SiO₂ |
|  | r28 = −358.10120 | d28 = 3.42596 |  |
|  | r29 = −6427.57519 | d29 = 17.00000 | SiO₂ |
| Aspherical Surface | r30 = 268.46014 | d30 = 17.29040 |  |
|  | r31 = 312.59734 | d31 = 18.06066 | SiO₂ |
|  | r32 = 187.02633 | d32 = 39.67385 |  |
|  | r33 = 5038.91186 | d33 = 15.00000 | SiO₂ |
|  | r34 = 152.80935 | d34 = 32.89949 |  |
|  | r35 = −1266.52726 | d35 = 12.38230 | SiO₂ |
| Aspherical Surface | r36 = 488.73734 | d36 = 11.17247 |  |
|  | r37 = 909.44854 | d37 = 37.53576 | SiO₂ |
|  | r38 = −227.20912 | d38 = 2.64792 |  |
| Aspherical Surface | r39 = 527.01980 | d39 = 15.00000 | SiO₂ |
|  | r40 = 306.05858 | d40 = 6.82121 |  |
| Aspherical Surface | r41 = 314.07332 | d41 = 59.13044 | SiO₂ |
|  | r42 = −226.00767 | d42 = 42.81271 |  |
|  | r43 = 710.23699 | d43 = 34.98128 | SiO₂ |
|  | r44 = −1416.98175 | d44 = 5.19542 |  |
| Aperture Stop 1 | r45 = ∞ | d45 = 11.79859 |  |
| Aperture Stop 2 | r46 = ∞ | d46 = 1.00000 |  |
| Aspherical Surface | r47 = 540.08365 | d47 = 42.97739 | SiO₂ |
|  | r48 = −333.38314 | d48 = −7.00000 |  |
| Aperture Stop 3 | r49 = ∞ | d49 = 8.00000 |  |
|  | r50 = 185.39931 | d50 = 36.98466 | SiO₂ |
| Aspherical Surface | r51 = 5111.36331 | d51 = 1.00000 |  |
|  | r52 = 78.22041 | d52 = 38.52383 | SiO₂ |
|  | r53 = 172.70908 | d53 = 1.00000 |  |
|  | r54 = 80.18403 | d54 = 37.76846 | SiO₂ |
|  | r55 = ∞ | d55 = 3.00000 | Water |
|  | r56 = ∞ | d56 = 0.00000 | Water |
|  |  | TT 1878.57716 |  |

TABLE 5

Aspherical DATA

| Surface Number | K | A | B | C |
|---|---|---|---|---|
| 2 | 0.0000000 | 2.7432792E−08 | −2.5615490E−12 | 4.0574773E−16 |
| 4 | 0.0000000 | 8.5428554E−08 | −4.9751307E−13 | −4.3963024E−16 |
| 10 | 0.0000000 | 2.0335307E−07 | 1.6136337E−11 | 3.2687229E−15 |
| 14 | 0.0000000 | 1.6974276E−07 | 1.4147300E−11 | 3.3139005E−16 |
| 17 | 0.0000000 | −1.2732737E−08 | 3.0271335E−14 | −1.2437317E−18 |
| 21 | −1.7398653 | 0.0000000E+00 | 0.0000000E+00 | 0.0000000E+00 |
| 22 | −0.7426191 | 0.0000000E+00 | 0.0000000E+00 | 0.0000000E+00 |
| 25 | −1.0242038 | 0.0000000E+00 | 0.0000000E+00 | 0.0000000E+00 |
| 26 | −0.2766891 | 0.0000000E+00 | 0.0000000E+00 | 0.0000000E+00 |
| 30 | 0.0000000 | −9.2657064E−08 | 3.9348832E−14 | 1.2760844E−16 |
| 36 | 0.0000000 | 4.9982201E−08 | 2.0607747E−12 | −1.2363248E−16 |
| 39 | 0.0000000 | −3.6413469E−08 | 4.1756539E−13 | 1.1777651E−16 |
| 41 | 0.0000000 | −1.5798642E−08 | 6.6478338E−14 | −9.2046166E−17 |
| 47 | 0.0000000 | −1.4920421E−08 | −2.4591555E−13 | 3.0537592E−17 |
| 51 | 0.0000000 | −2.9480585E−08 | 2.3593582E−12 | 3.4771792E−17 |

| Surface Number | D | E | F |
|---|---|---|---|
| 2 | −2.6199856E−20 | −7.9001139E−25 | 1.5280820E−28 |
| 4 | 5.8618954E−20 | −2.7564328E−24 | 2.8581860E−29 |

TABLE 5-continued

Aspherical DATA

| | | | |
|---|---|---|---|
| 10 | 9.0866227E−19 | 3.1929390E−22 | 1.5127264E−35 |
| 14 | −1.4245774E−21 | −1.4783031E−23 | 8.9980415E−28 |
| 17 | 2.1399058E−23 | −4.6269301E−28 | 2.7824239E−33 |
| 21 | 0.0000000E+00 | 0.0000000E+00 | 0.0000000E+00 |
| 22 | 0.0000000E+00 | 0.0000000E+00 | 0.0000000E+00 |
| 25 | 0.0000000E+00 | 0.0000000E+00 | 0.0000000E+00 |
| 26 | 0.0000000E+00 | 0.0000000E+00 | 0.0000000E+00 |
| 30 | −4.3620593E−21 | −2.1094849E−26 | 2.5061442E−30 |
| 36 | −8.9063677E−21 | −4.4938672E−27 | 3.4808590E−30 |
| 39 | −6.4269501E−21 | 2.3350124E−25 | −7.5055047E−30 |
| 41 | 6.0261198E−21 | −2.0701835E−25 | 2.6977447E−30 |
| 47 | 1.7455885E−21 | −1.2224718E−25 | 1.8384286E−30 |
| 51 | −6.8568697E−21 | 3.6576165E−25 | −5.4395859E−30 |

The constituent factors or elements of the lenses are almost the same as those of the first numerical embodiment. However, the second numerical embodiment further includes a third aperture stop SP3 between lenses L121 and L122 which are nearer to the second object (wafer) than a second aperture stop SP2.

Figure 5:
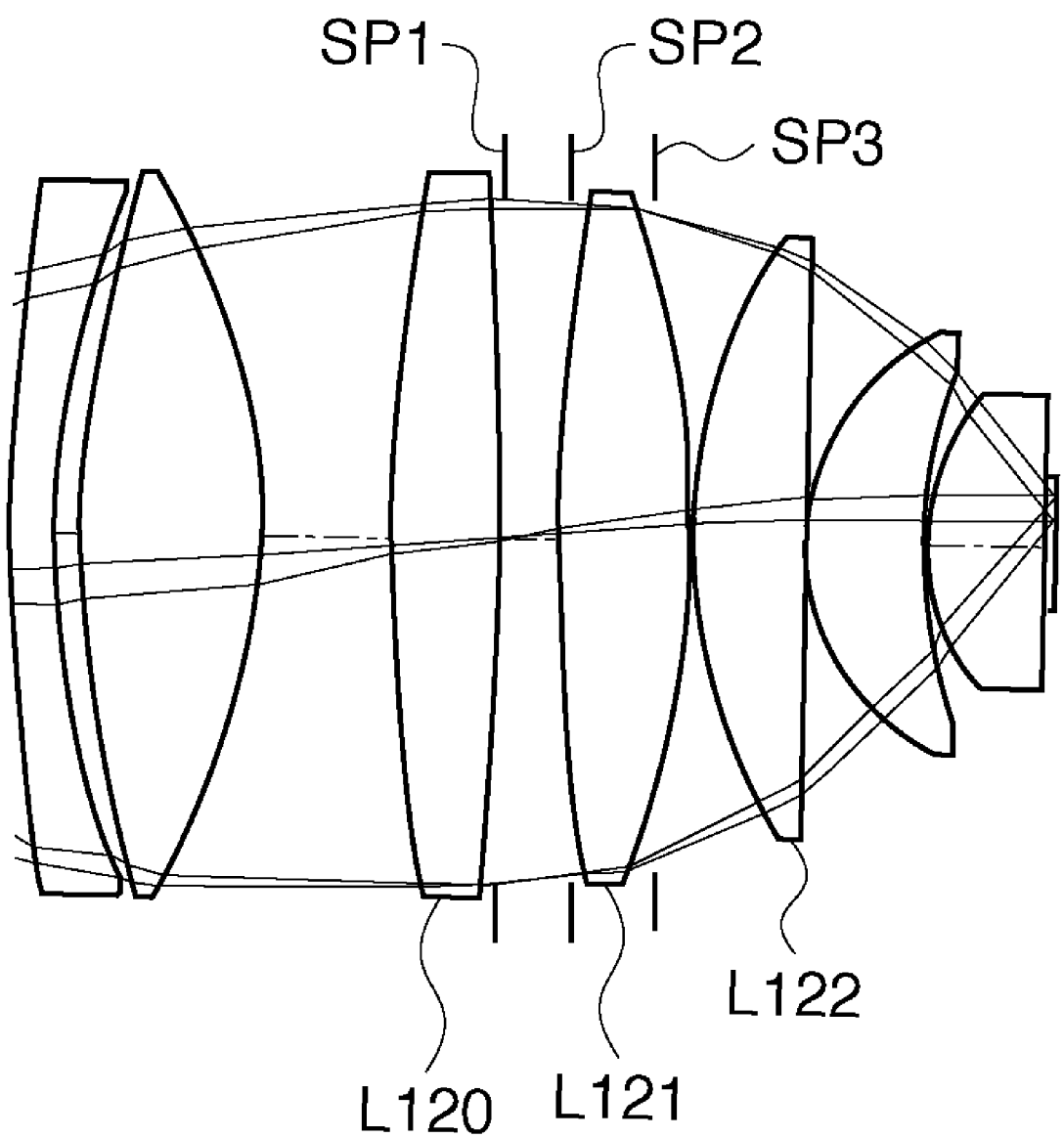
FIG. 5 is an enlarged sectional view near the aperture stops of the a projection optical system of the second numerical embodiment.

FIG. 5 is an enlarged sectional view near aperture stops in the second numerical embodiment. The curvature of the pupil increases in the high NA area, as has been described above. As shown in FIG. 5, the pupil position in the high NA area exceeds the desired position from the first object (reticle) side of the lens L121 to the second object (wafer) side.

In order to achieve good optical performance with NAmax=1.20, the third aperture stop SP3 is positioned nearer to the second object (wafer) side than the lens L121. Therefore, the lens L121 is positioned between the second and third aperture stops SP2 and SP3. Note that there is no need to position a lens between the second and third aperture stops SP2 and SP3.

Table 6 shows aperture stop diameters corresponding to the respective NAs in the second numerical embodiment.

TABLE 6

| NA | Aperture Stop 1 Diameter | Aperture Stop 2 Diameter | Aperture Stop 3 Diameter |
|---|---|---|---|
| 1.20 | 226.071 | 224.156 | 214.103 |
| 1.15 | 208.076 | 207.177 | — |
| 1.10 | 193.368 | 192.499 | — |
| 1.05 | 179.976 | 179.463 | — |
| 1.00 | 167.717 | 167.489 | — |
| 0.95 | 153.323 | 156.352 | — |
| 0.90 | 145.479 | 156.352 | — |
| 0.85 | 135.361 | 156.352 | — |
| 0.80 | 125.731 | 156.352 | — |
| 0.75 | 116.438 | 156.352 | — |

As in the first numerical embodiment, the size of the opening of the first aperture stop SP1 changes from NAmax=1.20 to NAmin=0.75. The size of the opening of the second aperture stop SP2 changes on the high NA side with NA=0.95 or more. The third aperture stop SP3 is an aperture stop having a fixed diameter which adjusts only a light beam corresponding to NAmax=1.20.

Figure 6:
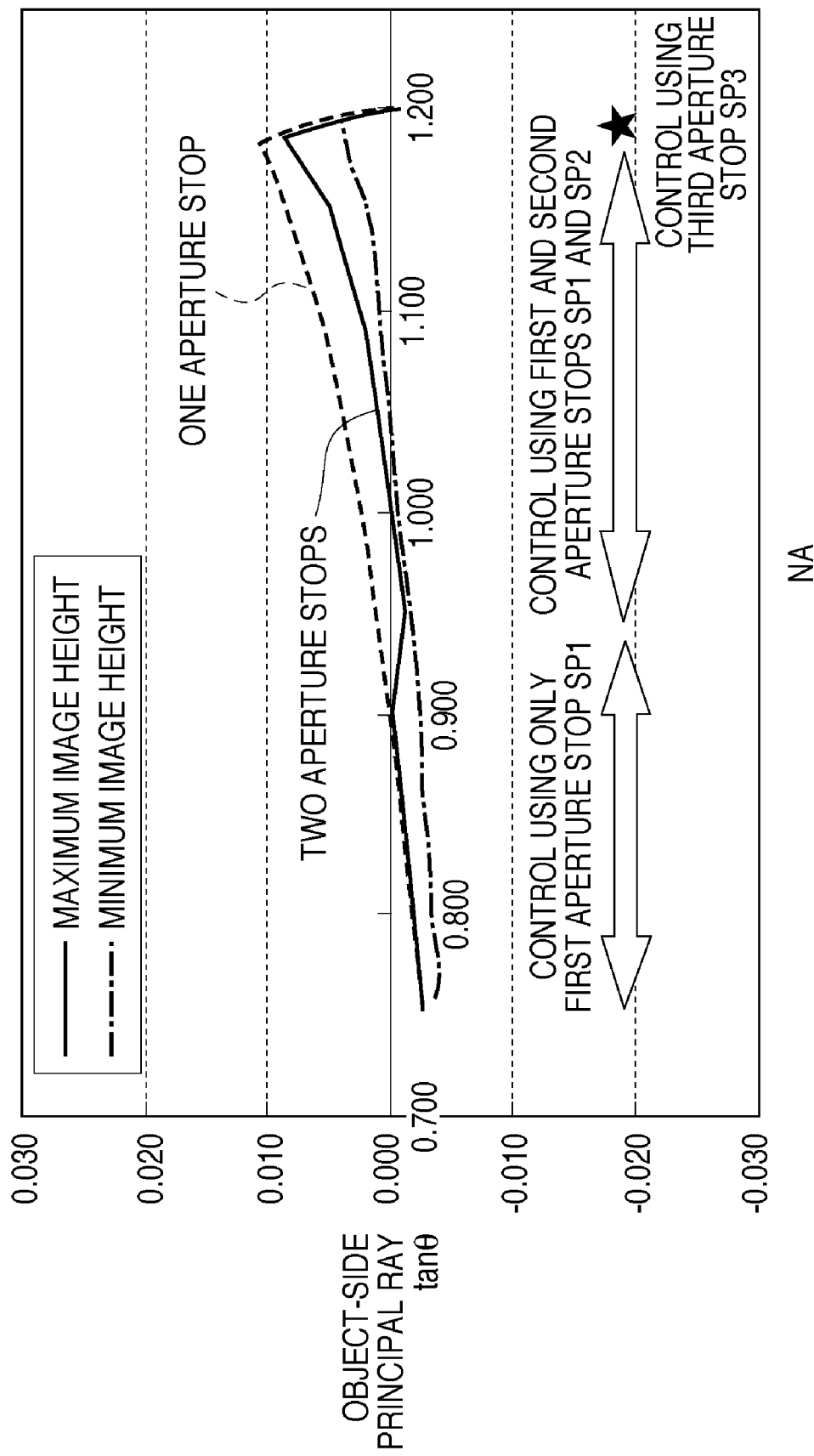
FIG. 6 is a graph showing telecentricity in the second numerical embodiment.

FIG. 6 shows the telecentricity (tan θ of an object-side principal ray) of the second numerical embodiment. The solid line represents the telecentricity obtained by two aperture stops at the maximum image height, the dotted line represents the telecentricity obtained by only one aperture stop at the maximum image height, and the chain line represents the telecentricity obtained by only one aperture stop at the minimum image height. As shown in FIG. 6, it is difficult to achieve a desired telecentricity by using only the aperture stop SP1. The second numerical embodiment can achieve a desired image-side telecentric characteristic in the entire wide NA range of NAmax=1.20 to NAmin=0.75. In addition, using the third aperture stop SP3 makes it possible to achieve better optical performance especially at NAmax=1.20.

FIG. 7 shows the NA uniformity (NAmax=1.20 and NAmin=0.75) of the second numerical embodiment of the present invention. Referring to FIG. 7, a solid line sagi. represents an NA with respect to a sagittal ray, and a dotted line meri. represents an NA with respect to a meridional ray. It is possible to achieve desired inter-image-height NA uniformity with NAmax=1.20 and NAmin=0.75. Using the third aperture stop SP3 makes it possible to achieve better optical performance especially at NAmax=1.20.

Third Numerical Embodiment

Figure 8A:
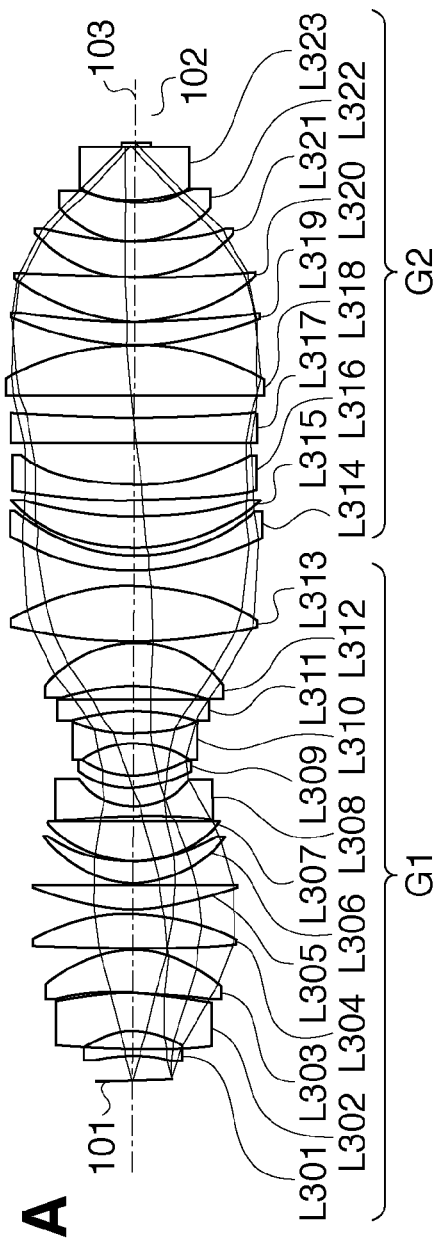
FIG. 8A is a sectional view of a projection optical system according to the third numerical embodiment.

FIG. 8A shows the lens arrangement of a dioptric projection optical system as the third numerical embodiment of the present invention. The dioptric projection optical system comprises an imaging optical system G1 and an imaging optical system G2 sequentially arranged from the first object 101 side along an optical path.

In the third numerical embodiment, the imaging optical system G1 comprises lenses L301 to L316. More specifically, the imaging optical system G1 sequentially has, from the first object side, the aspherical negative lens L301 having a biconcave shape with its concave surface facing the first object side, the negative lens L302 having a meniscus shape with its concave surface facing the first object side, and the aspherical positive lens L303 having a meniscus shape with its concave surface facing the first object side. Following the lens L303, the imaging optical system G1 sequentially has the positive lens L304 having a biconvex shape, the positive lens L305 having a biconvex shape, the positive lens L306 having a meniscus shape with its convex surface facing the first object side, and the positive lens L307 having a meniscus shape with its convex surface facing the first object side. Following the lens L307, the imaging optical system G1 sequentially has the negative lens L308 having a biconcave shape, the aspherical negative lens L309 having a meniscus shape with its convex surface facing the first object side, the aspherical negative lens L310 having a biconcave shape, and the aspherical negative lens L311 having a biconcave shape. Following the lens L311, the imaging optical system G1 sequentially has the aspherical positive lens L312 having a meniscus shape with its concave surface facing the first object side, the positive lens L313 having a biconvex shape, and the negative lens L314 having a meniscus shape with its convex surface facing the first object side. Following the lens L314, the imaging optical system G1 sequentially has the positive lens L315 having a meniscus shape with its convex surface facing the first object side and the negative lens L316 having a meniscus shape with its convex surface facing the first object side.

The imaging optical system G2 comprises lenses L317 to L323. The imaging optical system G2 sequentially has the meniscus negative lens L317 with its concave surface facing the second object side, the positive lens L318 having a meniscus shape with its convex surface facing the second object side, the positive lens L319 having a meniscus shape with its concave surface facing the second object side, and the positive lens L320 having a meniscus shape with its concave surface facing the second object side. Following the lens L320, the imaging optical system G2 sequentially has the aspherical positive lens L321 having a meniscus shape with its concave surface facing the second object side, the aspherical positive lens L322 having a meniscus shape with its concave surface facing the second object side, and the positive lens L323 having a plano-convex shape with its flat surface facing the second object side. The space between the positive lens L323 and the second object 102 is filled with a liquid.

Figure 9:
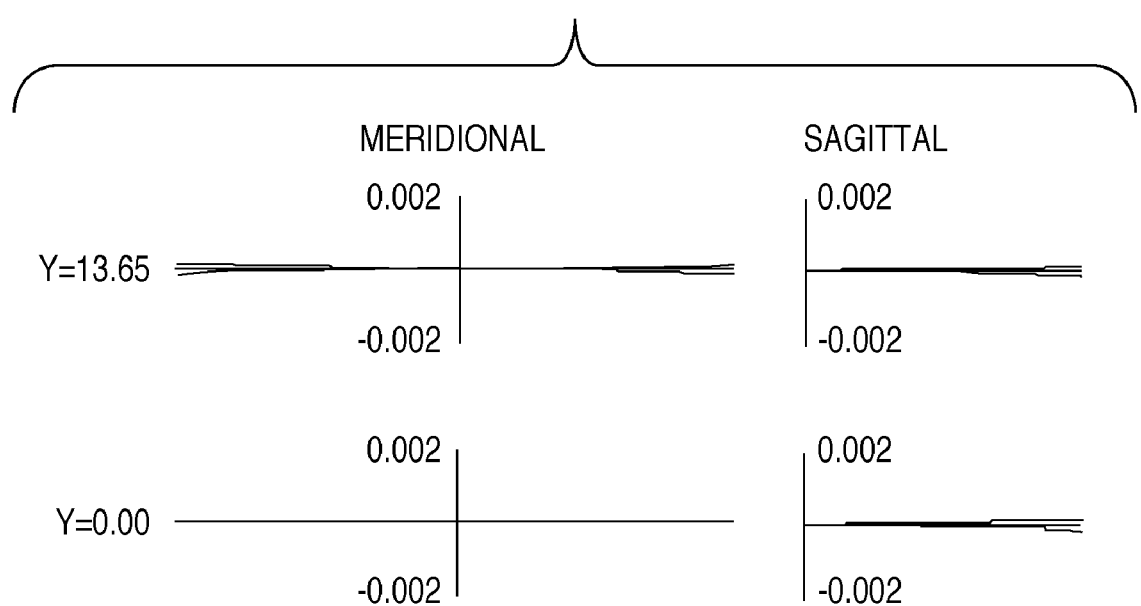
FIG. 9 is a view showing the transverse aberration of the projection optical system of the third numerical embodiment.

In the third numerical embodiment, a projection magnification β is ¼, the reference wavelength is 193 nm, and quartz is used as a glass material. In addition, the image-side numerical aperture is given by NAmax=1.10 and NAmin=0.80, and the inter-object distance (between the first object surface and the second object surface) is given by TT=1293 mm. Aberration correction is performed in the range of image heights of 0.00 to 13.65 mm, and a rectangular illumination area having a length of at least 26 mm and a width of at least 8 mm can be secured. FIG. 9 is a transverse aberration diagram in the third numerical embodiment. Referring to FIG. 9, "meridional" represents aberration with respect to a meridional ray included in a meridian plane including a principal ray and an optical axis, and "sagittal" represents transverse aberration with respect to a sagittal ray included in a sagittal plane which includes the principal ray and is perpendicular to "meridional". FIG. 9 shows the transverse aberration for the reference wavelength of 193.0 nm and wavelengths of ±0.2 pm. As is obvious, monochromatic aberration and chromatic aberration are properly corrected.

Tables 7 and 8 show various constituent factors or elements of the third numerical embodiment.

TABLE 7

NA = 1.20
β = ¼

| | Radius of Curvature [mm] | Surface Interval [mm] | Material |
|---|---|---|---|
| | r0 = ∞ | d0 = 29.87026 | |
| Aspherical Surface | r1 = −304.49595 | d1 = 10.00000 | SiO₂ |
| | r2 = 692.35974 | d2 = 27.05377 | |
| | r3 = −116.11604 | d3 = 51.94394 | SiO₂ |
| | r4 = −470.78692 | d4 = 1.00000 | |
| Aspherical Surface | r5 = −563.20105 | d5 = 56.46721 | SiO₂ |
| | r6 = −177.98533 | d6 = 1.03435 | |
| | r7 = 1151.56731 | d7 = 50.00000 | SiO₂ |
| | r8 = −306.76278 | d8 = 8.07394 | |
| | r9 = 352.20666 | d9 = 37.85641 | SiO₂ |
| | r10 = −4473.45931 | d10 = 1.00000 | |
| | r11 = 161.88125 | d11 = 26.96106 | SiO₂ |
| | r12 = 213.53714 | d12 = 1.00000 | |
| | r13 = 168.54454 | d13 = 50.00000 | SiO₂ |

TABLE 7-continued

NA = 1.20
β = ¼

| | Radius of Curvature [mm] | Surface Interval [mm] | Material |
|---|---|---|---|
| | r14 = 2230.45003 | d14 = 10.43362 | |
| | r15 = −998.41153 | d15 = 13.00000 | SiO₂ |
| | r16 = 90.71509 | d16 = 30.32521 | |
| | r17 = 191.38230 | d17 = 13.00000 | SiO₂ |
| Aspherical Surface | r18 = 128.31110 | d18 = 45.66300 | |
| | r19 = −134.63479 | d19 = 13.00000 | SiO₂ |
| Aspherical Surface | r20 = 221.88405 | d20 = 30.72301 | |
| | r21 = −322.09002 | d21 = 13.00000 | SiO₂ |
| Aspherical Surface | r22 = 2184.86848 | d22 = 20.99045 | |
| Aspherical Surface | r23 = −355.04563 | d23 = 60.07647 | SiO₂ |
| | r24 = −157.39221 | d24 = 2.81348 | |
| | r25 = 766.56757 | d25 = 77.54185 | SiO₂ |
| | r26 = −324.96418 | d26 = 20.25679 | |
| | r27 = 351.01024 | d27 = 20.25748 | SiO₂ |
| | r28 = 253.62569 | d28 = 11.26635 | |
| | r29 = 270.14246 | d29 = 45.79923 | SiO₂ |
| | r30 = 694.53594 | d30 = 18.63976 | |
| | r31 = 1241.67154 | d31 = 21.00000 | SiO₂ |
| | r32 = 333.12748 | d32 = 58.00684 | |
| | r33 = 28749.79451 | d33 = 36.55161 | SiO₂ |
| | r34 = 1899.33919 | d34 = 31.24210 | |
| | r35 = −6400.00000 | d35 = 70.00000 | SiO₂ |
| | r36 = −362.79788 | d36 = −17.00000 | |
| Aperture Stop 1 | r37 = ∞ | d37 = 27.00000 | |
| Aperture Stop 2 | r38 = ∞ | d38 = −9.00000 | |
| | r39 = 427.05576 | d39 = 30.05604 | SiO₂ |
| | r40 = 1096.77843 | d40 = 1.00000 | |
| | r41 = 254.41525 | d41 = 59.82015 | SiO₂ |
| | r42 = 1706.65242 | d42 = 1.00000 | |
| | r43 = 185.95680 | d43 = 48.61629 | SiO₂ |
| Aspherical Surface | r44 = 579.09491 | d44 = 1.00000 | |
| | r45 = 138.29502 | d45 = 53.63916 | SiO₂ |
| Aspherical Surface | r46 = 132.86681 | d46 = 2.74551 | |
| | r47 = 162.14883 | d47 = 75.60201 | SiO₂ |
| | r48 = ∞ | d48 = 3.00000 | water |
| | r49 = ∞ | d49 = 0.00000 | water |
| | | TT 1293.32736 | |

TABLE 8

Aspherical DATA

| Surface Number | K | A | B | C |
|---|---|---|---|---|
| 2 | 0.6077700 | 1.0144400E−07 | −15.407800E−11 | −3.5665400E−16 |
| 6 | −2.0000000 | −1.3880000E−08 | 2.0966700E−12 | −2.9233200E−17 |
| 19 | −1.1260200 | −1.2789200E−08 | 6.6111800E−12 | 2.5219100E−16 |
| 21 | −0.8824700 | 5.7061700E−08 | −1.4950900E−11 | 5.5602300E−16 |
| 23 | −1.9518400 | 1.8785000E−08 | 1.4510300E−12 | −1.2701100E−16 |
| 24 | 0.2125000 | 5.4344100E−09 | 1.3887100E−12 | 1.6902700E−17 |
| 47 | 0.6468800 | 2.0402800E−08 | −3.8855900E−13 | 2.3485200E−17 |
| 49 | −1.1276000 | −4.1564300E−08 | −2.2387300E−12 | 1.6853200E−16 |

| Surface Number | D | E | F | G |
|---|---|---|---|---|
| 2 | −4.4026300E−19 | 2.4557300E−22 | −1.1845300E−25 | 3.3586400E−29 |
| 4 | 2.6294700E−21 | −2.8831700E−25 | 1.0409600E−29 | −5.1328800E−34 |
| 10 | −1.1023300E−19 | 4.3671600E−23 | −1.3865900E−26 | 2.5450800E−30 |
| 14 | 8.3819400E−20 | −8.0385600E−24 | −5.8915200E−28 | 1.2167500E−31 |
| 17 | −5.1693200E−21 | −8.8694100E−26 | −3.3530600E−29 | 1.4166500E−32 |
| 21 | −1.0394700E−21 | −1.2845100E−25 | −1.1371600E−29 | −2.2824700E−34 |
| 22 | −1.0394700E−21 | 4.7088000E−26 | −1.4841800E−30 | 2.9391600E−35 |
| 25 | 1.8608400E−21 | 2.0148300E−24 | −6.4281600E−28 | 8.0286600E−32 |

Let $r_i$ be the radius of curvature of each surface corresponding to a surface number, and $d_i$ be the intervals between the respective surfaces. The refractive indexes of lens glass material $SiO_2$ and pure water with respect to the reference wavelength $\lambda=193.0$ nm are 1.5609 and 1.437, respectively. The refractive indexes of $SiO_2$ with respect to wavelengths of +0.2 pm and −0.2 pm relative to the reference wavelength are 1.56089968 and 1.56090031, respectively. The refractive indexes of pure water with respect to these wavelengths are 1.43699576 and 1.437000424, respectively.

Assume that the shape of each aspherical surface is given by $$X=(H^2/4)/(1+((1-(1+K)\cdot(H/r)2))^{1/2})+AH^4+BH^6+CH^8+DH^{10}+EH^{12}+FH^{14}+GH^{16}$$

where X is a displacement amount from the lens vertex in the optical axis direction, H is the distance from the optical axis, r is a radius of curvature, K is a conic constant, and A, B, C, D, E, F, and G are aspherical coefficients.

Figure 8B:
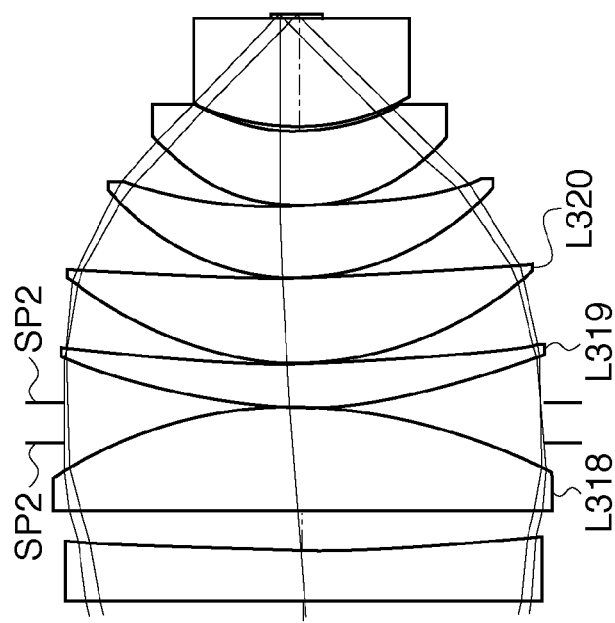
FIG. 8B is an enlarged sectional view near the aperture stops of the projection optical system of the third numerical embodiment.

The characteristics of the aperture stops in the third numerical embodiment will be described next. The aperture stops SP1 and SP2 in the third numerical embodiment are positioned between the lenses L318 and L319. FIG. 8B is an enlarged sectional view near the aperture stops. Like the catadioptric projection optical system described in the first numerical embodiment, the dioptric projection optical system of the third numerical embodiment satisfies both the requirements for a further increase in NA and miniaturization. As is easily understood from FIG. 8B, therefore, the pupil largely curves toward the second object (wafer) side from the lens L318 having the maximum effective diameter in the imaging optical system G2.

In the third numerical embodiment as well, therefore, in order to achieve good optical performance in a wide NA area, the plurality of aperture stops SP1 and SP2 are positioned nearer to the second object (wafer) side than the lens L318 having the maximum effective diameter. In addition, adjusting a light beam by using a plurality of aperture stops can achieve a desired image-side telecentric characteristic and NA uniformity.

Table 9 shows aperture stop diameters corresponding to the respective NAs in the third numerical embodiment.

TABLE 9

| NA | Aperture Stop 1 Diameter | Aperture Stop 2 Diameter |
|---|---|---|
| 1.10 | 344.971 | 341.233 |
| 1.07 | 331.550 | 327.978 |
| 1.05 | 323.838 | 320.358 |
| 1.00 | 304.867 | 301.939 |
| 0.95 | 285.128 | 301.939 |
| 0.90 | 267.559 | 301.939 |
| 0.85 | 250.559 | 301.939 |
| 0.80 | 234.060 | 301.939 |

The first aperture stop SP1 determines a numerical aperture in the range of 0.80 or more to 1.10 or less, and changes the size of the opening from NAmax=1.10 to NAmin=0.80. The second aperture stop SP2 determines a numerical aperture in the range of 1.00 or more to 1.10 or less, and changes the size of the opening only on the high NA side with NA=1.00 or more.

Figure 10:
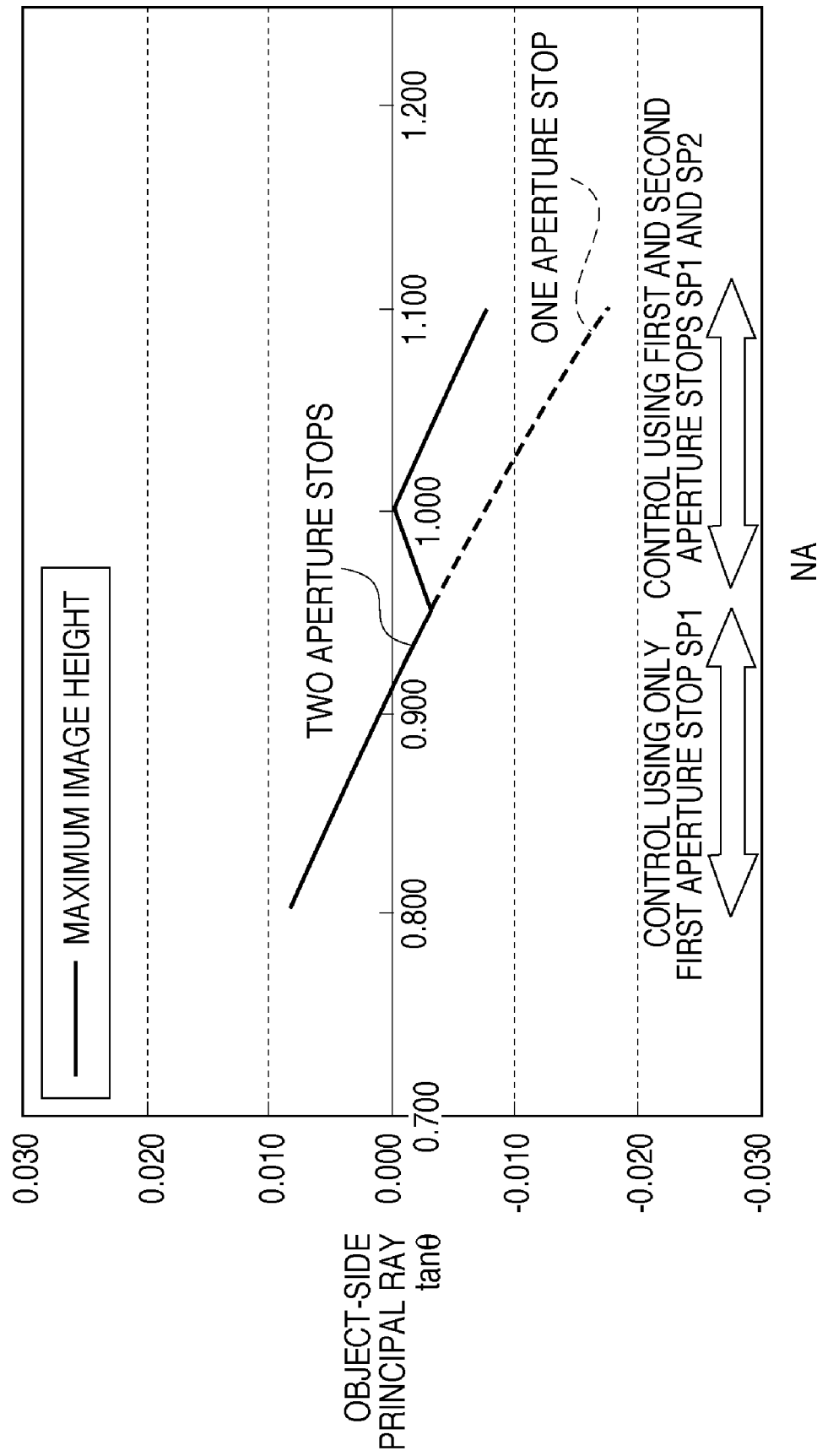
FIG. 10 is a graph showing telecentricity in the third numerical embodiment.

FIG. 10 shows the telecentricity (tan θ of an object-side principal ray) of the third numerical embodiment. The solid line represents the telecentricity obtained by two aperture stops at the maximum image height, and the dotted line represents the telecentricity obtained by only one aperture stop at the maximum image height. As shown in FIG. 10, it is difficult to achieve a desired telecentricity by using only the first aperture stop SP1. Using two aperture stops can achieve a desired image-side telecentric characteristic in the entire wide NA range of NAmax=1.10 to NAmin=0.80.

FIG. 11 shows the NA uniformity (NAmax=1.10 and NAmin=0.80) of the third numerical embodiment of the present invention. Referring to FIG. 11, a solid line sagi. represents an NA with respect to a sagittal ray, and a dotted line meri. represents an NA with respect to a meridional ray. Using two aperture stops can achieve desired inter-image-height NA uniformity with NAmax=1.10 and NAmin=0.80.

The first, second, and third numerical embodiments each have exemplified the immersion projection optical system in which the space between the final lens of the projection optical system and the image plane is filled with pure water. However, the present invention can also be applied to projection optical systems other than immersion projection optical systems. The space between the final lens and the image plane can be a vacuum or filled with a gas, a liquid, or a solid.

In addition, first, second, and third numerical embodiments each have exemplified the projection optical system using quartz $SiO_2$ (having a refractive index of about 1.56) as a glass material. However, the present invention can also be applied to projection optical systems using high-refractive-index glass materials other than quarts.

For example, with a combination of quartz $SiO_2$ and pure water (having a refractive index of about 1.44) as in the first, second, and third numerical embodiments, the present invention can be applied to projection optical systems with up to NAmax of about 1.37. With a combination of quartz and a second-generation liquid (having a refractive index of about 1.65), the present invention can be applied to projection optical systems with up to NAmax of about 1.50. With a combination of LuAG and a second-generation liquid (having a refractive index of about 1.65), the present invention can be applied to projection optical systems with up to NAmax of about 1.60. With a combination of LuAG and a third-generation liquid (having a refractive index of about 1.8), the present invention can be applied to projection optical systems with up to NAmax of about 1.70.

[Embodiment of Exposure Apparatus]

An exemplary exposure apparatus to which the above projection optical system is applied will be described below. As shown in FIG. 12, the exposure apparatus has an illumination device 501, a reticle stage 502 which mounts an original (reticle), a projection optical system 503, and a wafer stage 504 which mounts a wafer as a substrate. The exposure apparatus projects and transfers by exposure a circuit pattern formed on a reticle onto a wafer, and may be of the step & repeat projection exposure scheme or the step & scan projection exposure scheme.

The illumination device 501 illuminates a reticle on which a circuit pattern is formed, and has a light source unit and illumination optical system. The light source unit uses, for example, a laser as a light source. The laser can be, for example, an ArF excimer laser with a wavelength of about 193 nm, a KrF excimer laser with a wavelength of about 248 nm, or an $F_2$ excimer laser with a wavelength of about 153 nm. However, the type of laser is not particularly limited to an excimer laser and may be, for example, a YAG laser, and the number of lasers is not particularly limited either. When a laser is used as the light source, a light beam shaping optical system for shaping a parallel light beam from the laser beam source into a desired beam shape, and an optical system for converting a coherent laser beam into an incoherent one are preferably used. Also, the light source which can be used for the light source unit is not particularly limited to a laser, and one or a plurality of mercury lamps or xenon lamps can be used.

The illumination optical system illuminates a mask and includes, for example, a lens, mirror, light integrator, and stop. As the projection optical system 503, a projection optical system like one of those described in the first to third numerical embodiments can be used.

The reticle stage 502 and the wafer stage 504 can move by, for example, a linear motor. In the step & scan projection exposure scheme, the stages 502 and 504 move synchronously. An actuator is separately provided to at least one of the wafer stage 504 and the reticle stage 502 to align the original pattern onto the substrate.

The above-described exposure apparatus can be used to manufacture micropatterned devices, for example, a semiconductor device such as a semiconductor integrated circuit, a micromachine, and a thin-film magnetic head.

A method of manufacturing a device using the above-described exposure apparatus will be exemplified next.

Devices (e.g., a semiconductor integrated circuit device and liquid crystal display device) are manufactured by a step of transferring by exposure a pattern onto a substrate using the exposure apparatus according to the above-described embodiment, a step of developing the substrate exposed in the exposing step, and other known steps (e.g., etching, resist removing, dicing, bonding, and packaging steps) of processing the substrate developed in the developing step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-250069, filed Sep. 26, 2007 which is hereby incorporated by reference herein in its entirety.

What is claimed is:

1. A projection optical system which projects an image of a first object onto a second object, the projection optical system comprising:

a plurality of lenses; and a plurality of aperture stops for determining a numerical aperture, wherein said plurality of aperture stops include a first aperture stop having an opening whose size is configured to be changed, and a second aperture stop having an opening whose size is configured to be changed, wherein said first aperture stop and said second aperture stop are positioned nearer to the second object than a lens having a maximum effective diameter among lenses included in an imaging optical system nearest to the second object, wherein at least one of said first aperture stop and said second aperture stop is positioned at or near a pupil of the imaging optical system, and wherein a range of a numerical aperture determined by said first aperture stop is larger than a range of a numerical aperture determined by said second aperture stop.

2. The projection optical system according to claim 1, wherein NAmin=NAmin1<NAmin2<NAmax1≦NAmax, and NAmin=NAmin1<NAmin2<NAmax2≦NAmax are satisfied when a range of a numerical aperture of said projection optical system is not less than NAmin to not more than NAmax, a range of a numerical aperture determined by said first aperture stop is not less than NAmin1 to not more than NAmax1, and a range of a numerical aperture determined by said second aperture stop is not less than NAmin2 to not more than NAmax2.

3. The projection optical system according to claim 2, wherein NAmax1=NAmax2=NAmax.

4. The projection optical system according to claim 1, wherein said second aperture stop is positioned nearer to the second object than said first aperture stop.

5. The projection optical system according to claim 1, wherein at least one lens included in the imaging optical system is positioned between said first aperture stop and said second aperture stop.

6. The projection optical system according to claim 1, wherein said plurality of aperture stops include a third aperture stop, and NAmin2<NAmin3≦NAmax3=NAmax is satisfied when a range of a numerical aperture determined by said third aperture stop is not less than NAmin3 to not more than NAmax3.

7. The projection optical system according to claim 6, wherein NAmin3=NAmax3=NAmax is satisfied.

8. The projection optical system according to claim 6, wherein said third aperture stop is positioned nearer to the second object than said second aperture stop.

9. The projection optical system according to claim 6, wherein said first aperture stop, said second aperture stop, at least one lens included in the imaging optical system, and said third aperture stop are sequentially positioned from the first object side.

10. An exposure apparatus for exposing a substrate to light via an original and a projection optical system,
    wherein the projection optical system comprises:
    a plurality of lenses; and
    a plurality of aperture stops for determining a numerical aperture,
    wherein said plurality of aperture stops include a first aperture stop having an opening whose size is configured to be changed, and a second aperture stop having an opening whose size is configured to be changed,
    wherein said first aperture stop and said second aperture stop are positioned nearer to the substrate than a lens having a maximum effective diameter among lenses included in an imaging optical system nearest to the substrate,
    wherein at least one of said first aperture stop and said second aperture stop is positioned at or near a pupil of the imaging optical system, and
    wherein a range of a numerical aperture determined by said first aperture stop is larger than a range of a numerical aperture determined by said second aperture stop.

11. A method of manufacturing a device, the method comprising:
    exposing a substrate to light by using an exposure apparatus;
    developing the exposed substrate; and
    processing the developed substrate to manufacture the device,
    wherein the exposure apparatus comprises a projection optical system,
    wherein the projection optical system comprises:
    a plurality of lenses; and
    a plurality of aperture stops for determining a numerical aperture,
    wherein said plurality of aperture stops include a first aperture stop having an opening whose size is configured to be changed, and a second aperture stop having an opening whose size is configured to be changed,
    wherein said first aperture stop and said second aperture stop are positioned nearer to the substrate than a lens having a maximum effective diameter among lenses included in an imaging optical system nearest to the substrate,
    wherein at least one of said first aperture stop and said second aperture stop is positioned at or near a pupil of the imaging optical system, and
    wherein a range of a numerical aperture determined by said first aperture stop is larger than a range of a numerical aperture determined by said second aperture stop.

* * * * *